United States Patent [19]

Lutz

[11] Patent Number: 4,547,739
[45] Date of Patent: Oct. 15, 1985

[54] SIGNAL DEMODULATION SYSTEM FOR WIDEBAND FM

[76] Inventor: Joseph F. Lutz, 1409 Tourney Dr., San Jose, Calif. 95131

[21] Appl. No.: 495,232

[22] Filed: May 16, 1983

[51] Int. Cl.$^4$ .............................................. H03D 3/00
[52] U.S. Cl. .................................... 329/145; 329/192; 455/214
[58] Field of Search .................... 329/145, 192, 110; 455/144, 214, 337

[56] References Cited

U.S. PATENT DOCUMENTS

| | | | |
|---|---|---|---|
| 3,100,875 | 8/1963 | Peterson | 329/145 |
| 3,404,346 | 10/1968 | Hall et al. | 329/145 X |
| 3,480,869 | 11/1969 | Hubbard | 329/145 X |
| 3,881,157 | 4/1975 | McLaughlin | 329/145 X |
| 4,054,840 | 10/1977 | Sato | 329/145 X |
| 4,119,919 | 10/1978 | Sugawara | 329/145 X |
| 4,245,559 | 1/1981 | Wakeman et al. | 329/145 X |

Primary Examiner—Eugene R. LaRoche
Assistant Examiner—Robert J. Pascal

[57] ABSTRACT

A frequency demodulation system for wideband FM is responsive to an incoming wideband frequency modulated signal to derive therefrom a demodulated output signal. The system includes a delay line having an input to which the incoming signal is applied and having an output at which a delayed incoming signal appears. The system also includes a differential amplifier having a first input to which the incoming signal is applied and a second input coupled to the delay line to receive the delayed signal. The amplifier performs direct vector addition of the incoming signal and delayed signal to produce at the output of the amplifier an amplitude modulated and frequency modulated signal which is the direct vector sum of the incoming signal and the delayed signal as amplified. The system also includes an envelope detector coupled at its input to the output of the amplifier and responsive to the amplifier output signal to produce at the detector output the demodulated signal.

4 Claims, 6 Drawing Figures

SIGNAL DEMODULATION SYSTEM FOR WIDEBAND FM

BACKGROUND OF THE INVENTION

Frequency demodulation apparatus incorporated in wideband frequency modulation systems typically utilizes delay line discrimination devices which employ double balanced mixers in combination with delay lines. Mixers have nonlinear signal transfer characteristics which have two adverse effects. In the first place the linearity of the mixer varies with frequency so that changes in bandwidth produce changes in linearity and vice versa. This is undesirable since bandwidth and the linearity cannot be selected independently of each other. Secondly, the sensitivity, or signal-to-noise ratio, of the device also varies with changes in bandwidth. This is also undesirable since sensitivity and signal-to-noise ratio cannot be selected independently of each other.

The present invention is directed toward a new type of demodulation system which is characterized by a significant reduction in nonlinear signal transfer characteristics and which enables wider bandwidth operation to be obtained than previously available for specified values of linearity and sensitivity or alternatively enables enhanced linearity and sensitivity to be obtained when bandwidths are not increased.

SUMMARY OF THE INVENTION

A signal demodulation system for wideband FM, in accordance with the principles of the invention, responds to an incoming wideband frequency modulated signal having a carrier signal frequency $W_c$ modulated at a frequency $W_m$, the signal having a peak deviation incremental frequency $\Delta W_p$, the modulation having an amplitude A.

In order to derive a demodulated output signal from the incoming signal, the system utilizes a delay line having a group delay $t_o$ which is essentially constant over the wideband of the wideband modulated signal where $t_o = N/(4f_c)$ where $W_c = 2\pi f_c$ and N is an odd integer. The line has an input to which the incoming signal is applied and has an output at which a delayed incoming signal appears.

The system also utilizes a differential amplifier having a first input to which the incoming signal is applied and a second input coupled to the delay line to receive the delayed signal. The amplifier performs direct vector addition of the incoming signal supplied thereto without delay and the signal delayed by transmission through the delay line, to produce as an output a amplitude modulated and frequency modulated signal which is the direct vector sum of the incoming signal and the delayed signal amplified by the gain $A_d$ of the amplifer, $A_d$ being which is essentially uniform over said wideband.

Finally, the system also utilizes an envelope detector coupled at its input to the output of the amplifier and responsive to the amplifier output signal to produce the demodulated signal at the detector output. The voltage envelope has an RMS value equal to the quantity $0.5AA_d[(1+\sin \Delta W_p t_o)^{\frac{1}{2}} - (1-\sin \Delta W_p t_o)^{\frac{1}{2}}]$.

The sensitivity of this system increases with increasing value of the voltage envelope, which as shown in the above equation, increases as the quantity $A_d$ increases. The apparatus employs a value of $A_d$ which is much larger than one whereby a substantial increase in voltage envelope and thus in sensitivity is obtained in this invention.

Moreover, the linearity of the differential amplifier is dependent upon the group delay $t_o$ which is directly proportional to N. If N were to be an even integer, the two signals, when unmodulated, would either be in phase or in phase opposition. However, as long as N is an odd integer, the incoming undelayed signal, when unmodulated, will be in quadrature with the delayed signal. This quadrature relationship of unmodulated signals is required for proper function of the differential amplifier.

As long as this quadrature relationship is maintained, the linearity is preserved as the phase difference between the two incoming signals is increased. As the value of N increases, this phase difference increases. For maximum sensitivity N can be increased until $1 - \sin \Delta W_p t_o = 0$.

DETAILED DESCRIPTION OF PREFERRED EMBODIMENTS

Referring now to FIGS. 1–5, an incoming signal is applied between terminals 10 and 12. The incoming signal is an intermediate frequency IF signal having a carrier frequency $W_c$. The frequency modulation system employed is wide band so that the total occupied bandwidth is at least 40% of the carrier frequency $W_c$ and in theory may be 200% of $W_c$. The signal has an amplitude A.

The incoming signal is supplied directly to input terminal R of differential amplifier 14. The incoming signal is also supplied to the input of delay line 16 and arrives at the output of the line with delay. The delayed incoming signal is supplied to another input terminal L of amplifier 14.

The amplifier is configured to produce at its output an output signal which is the direct vector sum of the signals applied at inputs R and L, amplified by the gain $A_d$ of the amplifier.

The output signal from the amplifier is then supplied to an envelope detector 18 which derives from the output signal the desired demodulated base band output signal which appears between output terminals 20 and 22.

The delay line has a group delay $t_o = N/(4f_c)$ (Note: $2\pi f_c = W_c$) which is constant over the frequency range employed and introduces a delay which is equivalent to a phase shift of $-(N)90°$ at the carrier frequency $W_c$ where N is an odd integer. The delay line is lossless so that the undelayed and delayed signals are identical except for phase.

Figure 2:
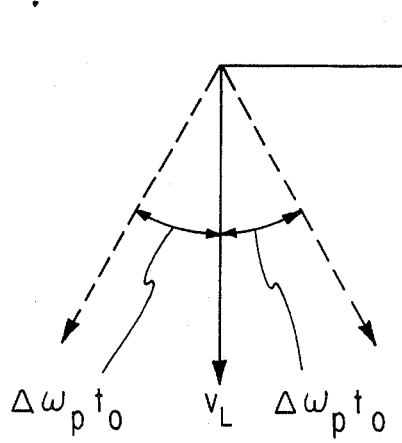
FIG. 2 illustrates the phase relationships between incoming undelayed and delayed signals in the presence and absence of modulation.
Figure 4:
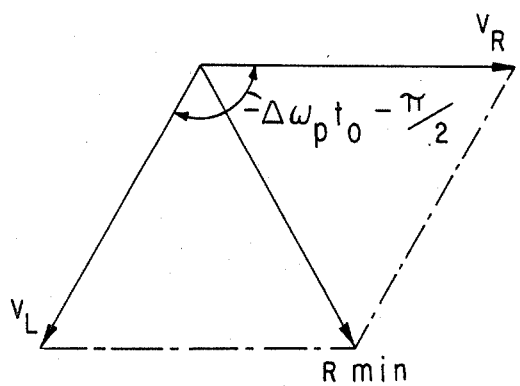
FIG. 4 illustrates the phase relationships between incoming undelayed and delayed signals when the modulated incoming signal attains its minimum amplitude value.
Figure 5:
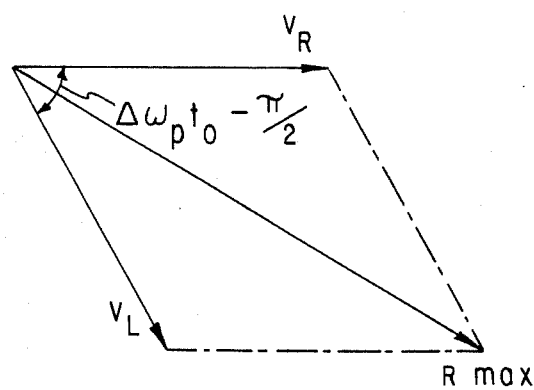
FIG. 5 illustrates the phase relationship between incoming undelayed and delayed signals when the modulated incoming signal attains its maximum amplitude value.

The differential amplifier is so configured that the incoming undelayed signal which appears at terminal R and is designated as $V_R$ in FIGS. 2, 4 and 5 and the incoming delayed signal which appears at terminal L and is designated as $V_L$ in FIGS. 2, 4 and 5 must be in quadrature when both signals are unmodulated. Hence, N must be an odd integer. The use of an even integer would produce delayed and undelayed signals which, when unmodulated, would either be in phase or in phase opposition.

Figure 3:
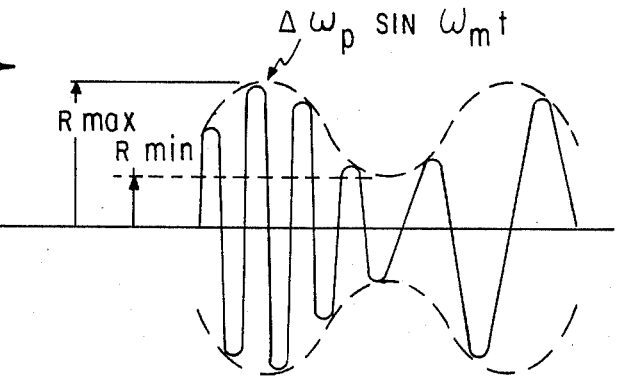
FIG. 3 illustrates the wave form of the output signal yielded by the differential amplifier.

When the signals $V_R$ and $V_L$ are modulated, the relative phase shift will swing between the two phase extremes as shown in FIG. 2. The output signal of the amplifier is the instantaneous vector sum (with amplification) of signals $V_R$ and $V_L$ and has a minimum value Rmin and a maximum value Rmax at the two phase extremes as shown in FIGS. 4 and 5. These relationships in the time domain are shown in FIG. 3.

The amount of phase shift is equal to the product $\Delta W_p t_o$ in radians.

As the size of the shift increases, the difference in value between Rmax and Rmin increases. As this difference increases, the sensitivity of the system increases for a given bandwidth or alternatively, for a fixed sensitivity the bandwidth can be increased. These considerations show that it is beneficial to increase the value of N. However, if the value of N is increased to too high a value, Rmin will be less than zero and distortion will result. Optimum results are obtained when N is equal to 3.

The envelope detector can be a conventional half wave rectifier or a full wave rectifier. For maximum bandwidth a full wave rectifier should be used.

The root mean square (RMS) value of the voltage of the demodulated signal or envelope is equal to the quantity $0.5 A A_d [(1 + \sin \Delta W_p t_o)^{\frac{1}{2}} - (1 - \sin \Delta W_p t_o)^{\frac{1}{2}}]$.

Consequently, the sensitivity of the system for a given level of amplitude A of the incoming signal increases with increasing gain $A_d$ of the amplifier.

The differential amplifier is a known component as for example supplied by Harris Semiconductor Inc. of Melbourne, Fla., under the type designation HA2539.

Figure 1:
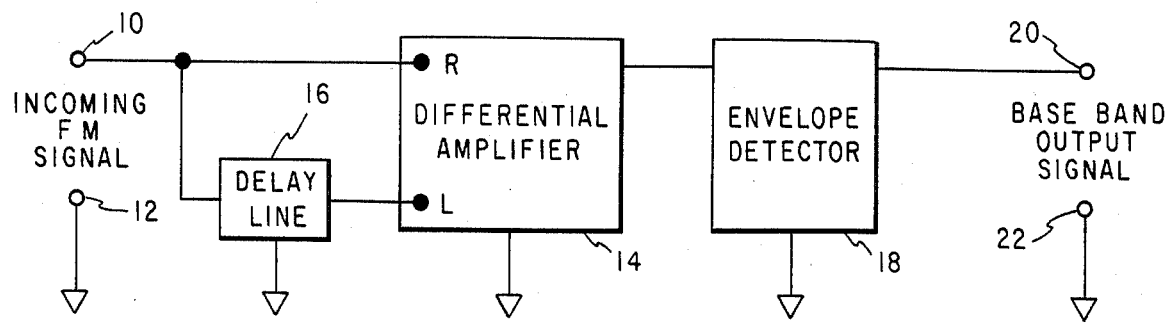
FIG. 1 is a block diagram of the invention.
Figure 6:
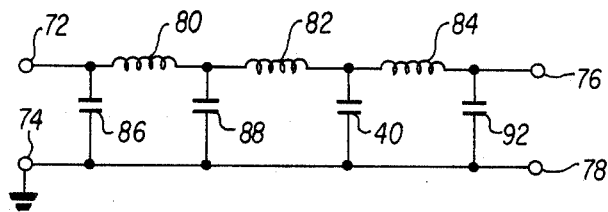
FIG. 6 is a circuit diagram of a lossless delay line which can be used in the invention.

FIG. 6 shows a lossless delay line for producing a 90° delay (N is equal to 1) which at a 70 MHz carrier signal frequency exhibits an input impedance at terminals 72 and 74 of 50 ohms and a like output impedance at terminals 76 and 78. Each of inductors 80, 82 and 84 has a value of 59.5 nanohenries. Capacitors 86, 88, 90 and 92 have values in picofarads of 11.9, 23.8, 23.8 and 11.9, respectively. Three such lines connected end to end will produce a 270° delay (N is equal to 3).

What is claimed is:

1. A signal demodulation system for wideband FM responsive to an incoming wideband frequency modulated signal of carrier signal frequency $W_c$ and modulated at a frequency $W_m$, the signal having a peak deviation incremental frequency $\Delta W_p$, the carrier having an amplitude A, to derive therefrom a demodulated output signal, said system comprising:

a lossless delay line having a group delay t which is essentially constant over the band of said wideband modulated signal where $t_o = N/(4f_c)$, N is an odd integer and $f_c = W_c/(2\pi)$, said line having an input to which said incoming signal is applied and having an output at which a delayed incoming signal appears;

a differential amplifier having a first input to which said incoming signal is applied and a second input coupled to the delay line to receive said delayed signal, said amplifier having an output and performing direct vector addition of the incoming signal and delayed signal to produce at said output an amplitude modulated and frequency modulated signal, which is the direct vector sum of the incoming signal and the delayed signal amplified by the gain $A_d$ of the amplifier, $A_d$ being essentially uniform over said wideband; and an envelope detector coupled at its input to the output of said amplifier and responsive to said amplifier output signal to produce at the detector output said demodulated signal, the envelope having an RMS value equal to the quantity $0.5 A A_d [(1 + \sin \Delta W_p t_o)^{\frac{1}{2}} - (1 - \sin \Delta W_p t_o)^{\frac{1}{2}}]$.

2. The system of claim 1 where N is at least equal to 3.

3. The system of claim 2 wherein $A_d$ is much larger than 1.

4. A signal demodulation system for wideband FM responsive to an incoming wideband frequency modulated signal to derive therefrom a demodulated output signal, said system comprising:

a lossless delay line having a group delay period which is essentially constant over the band of said wideband modulated signal, said line having an input to which said incoming signal is applied and an output at which said incoming signal suitably delayed appears, the signal delay having a value at which said incoming signal when unmodulated is in phase quadrature with the delayed signal when unmodulated;

a differential amplifier coupled to the output of said line, said amplifier having a first input responsive to the incoming signal and a second input responsive to the delayed output signal, said amplifier directly adding as vectors the signals supplied to the two amplifier inputs to produce at the amplifier output a signal which is in amplified form the vectorial sum of said addition; and an envelope detector coupled to the output of said amplifier and responsive to said amplifier output signal to derive therefrom said demodulated output signal.

* * * * *